United States Patent [19]

Thalapaneni

[11] Patent Number: 5,238,872
[45] Date of Patent: Aug. 24, 1993

[54] BARRIER METAL CONTACT ARCHITECTURE

[75] Inventor: Gurunada Thalapaneni, Union City, Calif.

[73] Assignee: Samsung Semiconductor, Inc., San Jose, Calif.

[21] Appl. No.: 956,455

[22] Filed: Oct. 2, 1992

Related U.S. Application Data

[63] Continuation of Ser. No. 626,715, Dec. 11, 1990, abandoned.

[51] Int. Cl.⁵ .............................. H01L 21/44
[52] U.S. Cl. .................... 437/190; 437/192; 437/194; 156/643
[58] Field of Search ............... 437/189, 190, 192, 194; 156/643

[56] References Cited

U.S. PATENT DOCUMENTS

| | | | |
|---|---|---|---|
| 4,658,496 | 4/1987 | Beinvogl et al. | 437/56 |
| 4,727,046 | 2/1988 | Tuntasood et al. | 437/57 |
| 4,784,973 | 11/1988 | Stevens et al. | 437/190 |
| 4,829,024 | 5/1989 | Klein et al. | 437/192 |
| 4,960,732 | 10/1990 | Dixit et al. | 437/194 |
| 4,994,410 | 2/1991 | Sun et al. | 437/192 |
| 5,010,026 | 4/1991 | Gomi | 437/203 |

FOREIGN PATENT DOCUMENTS

| | | | |
|---|---|---|---|
| 0279588 | 8/1988 | European Pat. Off. | 437/192 |
| 62-113421 | 5/1987 | Japan . | |
| 63-77115 | 4/1988 | Japan | 437/190 |

OTHER PUBLICATIONS

H. Ono et al., "Development of a Planarized Al-Si Contact Filling Technology", 1990 IEEE VMIC Conference, Jun. 12-13, 1990, pp. 76-81.

S. Wolf, Silicon Processing for the VLSI Era, vol. 2, Lattice Press, Sunset Beach Calif., 1990, pp. 124-126.

N. Fujimura et al., "Solid Phase Reactions and Change in Stress of TiN/Ti/Si for a Diffusion Barrier," J. Appl. Phys., vol. 67, No. 6, Mar., 1990, pp. 2899-2903.

Y. Pauleau, "Interconnect Materials for VLSI Circuits," Solid State Technology, vol. 30, No. 4, Apr. 1987, pp. 155-162.

Primary Examiner—Brian E. Hearn
Assistant Examiner—Laura M. Holtzman
Attorney, Agent, or Firm—Hecker & Harriman

[57] ABSTRACT

The interconnect system of the present invention is comprised of a TiW metal barrier layer as well as a Ti metal barrier layer deposited on the silicon surface. An anisotropic etch process for the Ti/TiW/Al metal sandwich has also been developed without corrosion and metal residue. The addition of the Ti layer between the TiW layer and the silicon surface reduces the contact resistance between the metal and P+ silicon contact. This Ti layer also effectively improves the blocking of aluminum migration to the silicon surface through TiW grain boundaries. In order to realize good ohmic metal-P+ contacts, the surface concentration of the silicon should be very high. Therefore, the present invention also employs a plasma mode etch which removes about 250 Å silicon since peak concentrations of P+ dopants (boron) are often found about 400 Å below the silicon surface. This plasma mode etch will also remove silicon damage caused by previous etching. A detailed etching process is also developed in the present invention so as to avoid any corrosion or metal residue.

16 Claims, 4 Drawing Sheets

FIG. 3(A)    M1 - N+ CONTACT RESISTANCE
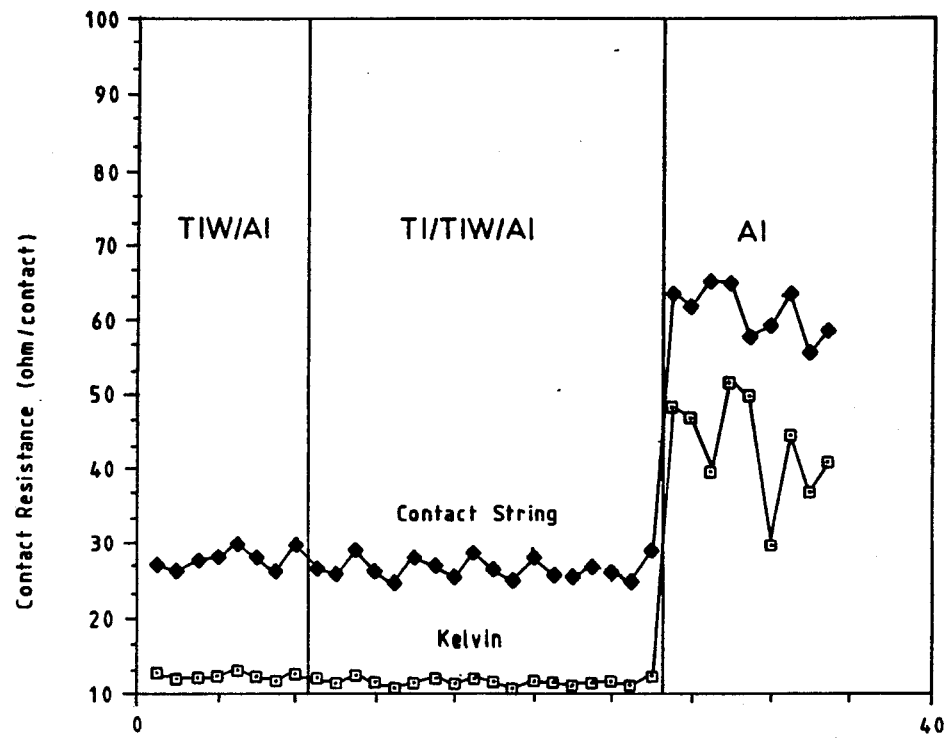
FIG. 3(B)    M1 - P+ CONTACT RESISTANCE
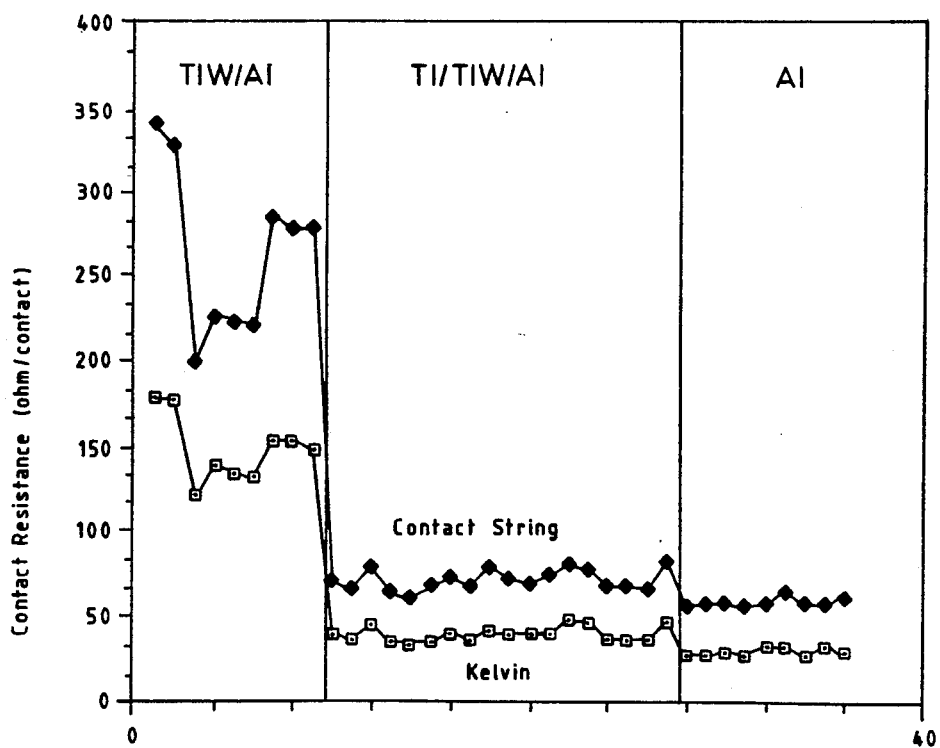

BARRIER METAL CONTACT ARCHITECTURE

This is a continuation of application Ser. No. 626,715 filed Dec. 11, 1990, now abandoned.

BACKGROUND OF THE PRESENT INVENTION

I. Field of the Invention

This invention relates to the field of barrier metal schemes implemented in VLSI devices.

II. Background Art

Integrated circuit devices are formed with semiconductor processing techniques in which conductive and insulative patterned layers are formed on the surface of a substrate, such as a monocrystalline silicon substrate. Devices formed in the semiconductor substrate are linked together through a "metallization" layer. A metallization layer is a pattern of metal or other conductive film used for interconnections, ohmic contacts and rectifying metal/semiconductor contacts. Aluminum is commonly used as a metal layer but other metals may be used as well, such as gold, platinum, etc. In addition, polycrystalline silicon can be used to form a conductive path.

There are some disadvantages when using aluminum as an interconnect metal layer or contact layer. For example, when aluminum is used as an electrical contact to an electrode region of an active device formed in a silicon substrate, the aluminum and silicon may interdiffuse. This can cause the aluminum to migrate into the silicon substrate below the junction formed between the doped region and the substrate, e.g., below the source or drain regions, thereby shorting out the device. Furthermore, silicon dissolves into aluminum during any subsequent high-temperature steps of the device fabrication process because of the relatively high solid solubility of silicon into aluminum. Thus, aluminum may propagate into the silicon substrate and thereby form spikes of aluminum into the substrate. The aluminum spikes will penetrate through the P-N junction in the silicon substrate and will accordingly destroy the P-N junction.

Contact and interconnect problems have become more sensitive as device geometry is scaled down to a submicron level. Such undesirable characteristics include high contact resistance, degradation of shallow junctions and aluminum migration. In order to overcome these problems in prior art, an interconnect system with barrier metals has been employed.

One prior art attempt to reduce the effects of aluminum migration is the use of a barrier layer between the aluminum layer and the silicon substrate, such as titanium tungsten (TiW). The barrier layer of titanium tungsten alloy is intended to prevent the formation of the aluminum spikes that can short the P-N junction.

In prior art, TiW has been applied as a barrier layer between the metal contact and silicon layer. Although TiW has been effective in providing good (low) metal to N+-well contact resistance, metal to P+-well contact resistance remains high and inconsistent. Furthermore, the TiW layer does not entirely eliminate the junction spiking since aluminum can still migrate through the TiW grain boundaries, degrading performance of the device.

One prior art scheme for providing a low resistance aluminum contact is described in Dixit, U.S. Pat. No. 4,884,123. Dixit describes a low resistance contact, which comprises a layer of titanium, a barrier layer formed over the titanium layer and a conductive layer formed over the barrier layer. In Dixit, a Ti layer and TiW layer are configured on a silicon substrate. An additional layer of tungsten or molybdenum is formed between the TiW layer and aluminum layer. The scheme of Dixit is a Ti/TiW/W/Al architecture.

Another prior art contact architecture is described in Sharma, U.S. Pat. No. 4,927,505. Sharma discloses a titanium-tungsten-nitride/titanium-tungsten/gold (TiWN/TiW/Au) packaging interconnect metallization scheme.

Black, U.S. Pat. No. 4,702,967 describes a Ti/TiN/Au contact scheme and Shankar, U.S. Pat. No. 4,782,380 describes a multi-layer conductive interconnection which is a barrier metal/conductor/barrier metal/Al architecture.

A disadvantage of these prior art contact architecture schemes is the complexity of processing resulting from implementing these schemes.

Therefore, it is an object of the present invention to provide an interconnect system for VLSI devices with low and consistent contact resistance values.

It is another object of the present invention to provide an interconnect system for VLSI devices that effectively prevents aluminum migration.

It is yet another object of the present invention to provide an interconnect system for VLSI devices that further improves metal-step coverage.

SUMMARY OF THE PRESENT INVENTION

The interconnect system of the present invention is comprised of a TiW metal barrier layer as well as a Ti metal barrier layer deposited on the silicon surface. An anisotropic etch process for the Ti/TiW/Al metal sandwich has also been developed without corrosion and metal residue. The addition of the Ti layer between the TiW layer and the silicon surface reduces the contact resistance between the metal and P+ silicon contact. This Ti layer also effectively improves the blocking of aluminum migration to the silicon surface through TiW grain boundaries.

In order to realize good ohmic metal-P+ contacts, the present invention also employs a plasma mode etch to improve the surface concentration of silicon. This plasma mode etch also removes silicon damage caused by previous etching.

A detailed etching process is also developed in the present invention so as to avoid any corrosion or metal residue.

BRIEF DESCRIPTION OF THE DRAWINGS

FIGS. 3A and 3B are graphs illustrating contact resistance values for both the prior art method and the present invention.

DETAILED DESCRIPTION OF THE PRESENT INVENTION

An interconnect system that prevents aluminum migration and provides lower electrical contact resistance is described. In the following description, numerous specific details, such as aluminum layer thickness and barrier thickness, etc., are described to provide a more thorough description of the present invention. It will be apparent, however, to one skilled in the art, that the present invention may be practiced without these specific details. In other instances, well known features have not been described in detail so as not to unnecessarily obscure the present invention.

The interconnect system of the present invention is particularly useful when integrated circuit technology is at the submicron level. A number of problems concerning interconnect fabrication and functionality are exacerbated when the device density in integrated circuits increases. Such problems include electromigration (the transport of mass in metals under the influence of current) as well as metal-step coverage.

As semiconductor devices become smaller, the corresponding current density in the aluminum becomes larger. High current densities can cause device failures due to electromigration. Electromigration occurs by the transfer of momentum from the electrons to the positive metal ions. When a high current passes through thin metal conductors in integrated circuits, metal ions in some regions will become concentrated; voids will form in other regions. The concentration of metal ions can short-circuit adjacent conductors, while the voids may result in an open circuit. Another problem that must be considered is aluminum spiking into the silicon substrate that can occur during annealing.

One prior art method to solve these undesirable properties is to add a barrier layer in between the aluminum and the substrate. This barrier layer, however, must meet the following requirements: 1) It forms low contact resistance with silicon; 2) It will not react with aluminum; and 3) Its deposition and formation are compatible with the overall process. Barrier metals, such as titanium nitride (TiN) and titanium tungsten (TiW) have been evaluated and found to be stable for contact annealing temperatures.

An example of a prior art contact architecture and processing scheme is illustrated in FIGS. 1A-1D.

Figure 1A:
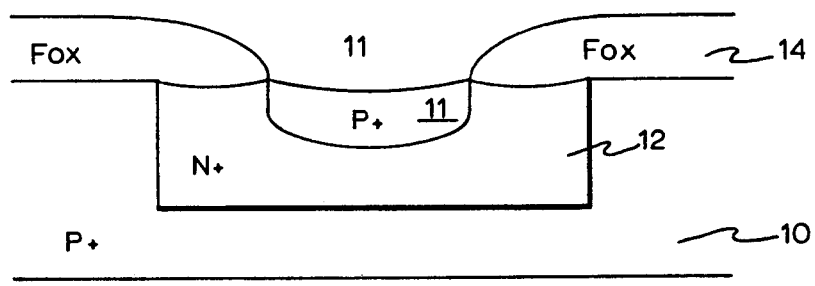
FIGS. 1A-1D are cross section profiles illustrating a prior art metal barrier processing scheme.

FIG. 1A illustrates a cross sectional view of a completed semiconductor structure 10 comprising a silicon substrate in which devices such as transistors and diodes have been formed. Such devices are depicted and identified by the reference numeral 12. A source or drain (S/D) well 11 is deposited within well 12. Well 11 is of a first type and well 12 is of a second dopant type. A first dielectric layer 14 is formed over the semiconductor 10. In the preferred embodiment, the dielectric layer 14 comprises a field oxide of silicon dioxide. A typical thickness of the field oxide is 5,000 Å. The field oxide is deposited by using a nitride mask over the desired contact area. This layer is then annealed typically at 900° C. for 20 minutes.

Figure 1B:
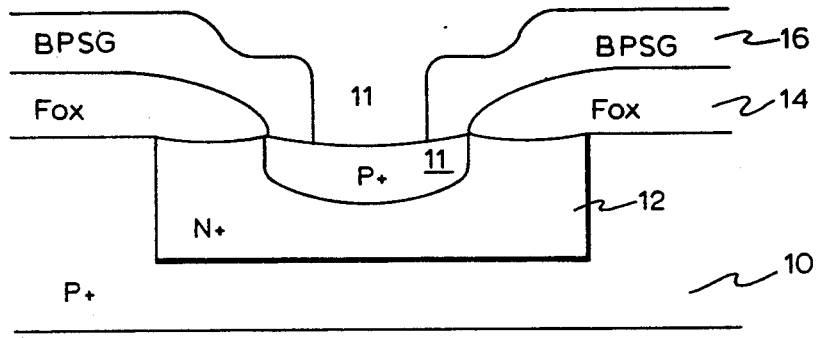

Referring to FIG. 1B, another insulating layer 16 of borophosphosilicate glass (BPSG) is deposited over first insulating layer 14 and semiconductor 10. The BPSG layer is typically 6,000-10,000 Å thickness and is thermally densified. The BPSG layer 16 is patterned so that the layer 16 completely covers first insulating layer 14 while also opening a contact hole over region 12. A wet/dry contact etch is used to etch the BPSG layer to open a contact hole. A wet buffered oxide etch is first employed to partially etch through. Then the etch is completed in a reactive ion etcher. The purpose of this etch method is to provide a more rounded shape of the BPSG at the top of the layer and provide a much more vertical sidewall going down to the S/D 11. This method provides improved step coverage. The composition of BPSG used in the present invention is typically 2-5% boron and 2-5% phosphorous.

The BPSG is a ternary (three component) oxide system $B_2O_3$-$P_2O_5$-$S_iO_2$ that is useful for isolation, passivation, and surface planarization. The process of contact reflow makes BPSG a more attractive material for use in processing over other materials, such as phosphosilicate glass. Following anisotropic etching, contact holes may have sharp upper corners which make them difficult to fill. By successfully rounding these sharp edges with a second thermal flow cycle, contact coverage by subsequent metal film is significantly improved. Thus, BPSG is employed in contact areas to create a smoother surface topography, thereby facilitating step coverage of subsequently deposited films. Because flow depends on BPSG composition, precise control of dopant uniformity across substrates is necessary to ensure uniform flow and consequent control of contact size. The BPSG can be deposited by a number of different chemical vapor deposition processes.

Figure 1C:
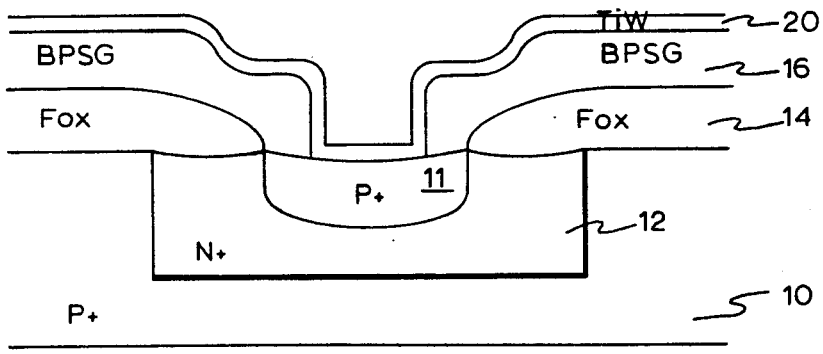
Figure 1D:
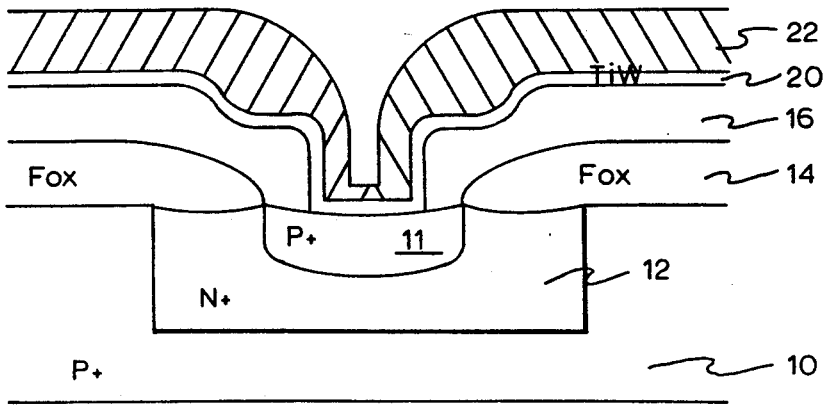

In FIG. 1C, a titanium tungsten (TiW) layer 20 is formed in the contact opening. The TiW layer contacts the P+ region 11 and is also disposed over the BPSG layer 16.

Next, an aluminum layer 22 is formed over the TiW layer 20 and acts as an interconnect layer to the P+ layer 11. As noted previously, the TiW layer 20 can reduce the metal to contact resistance, but does not prevent junction spiking, since aluminum can still migrate through the TiW grain boundaries.

Figure 2A:
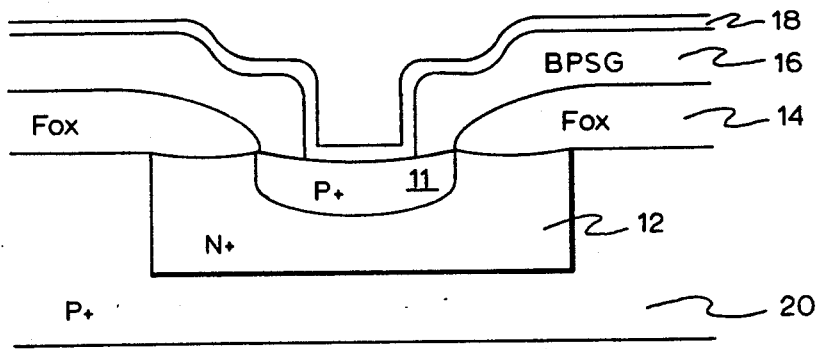
FIGS. 2A-2C are cross section profiles illustrating the metal barrier processing scheme of the present invention.
Figure 2B:
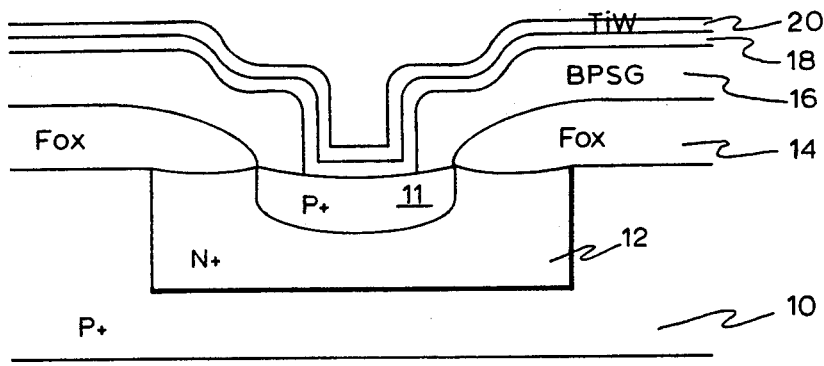
Figure 2C:
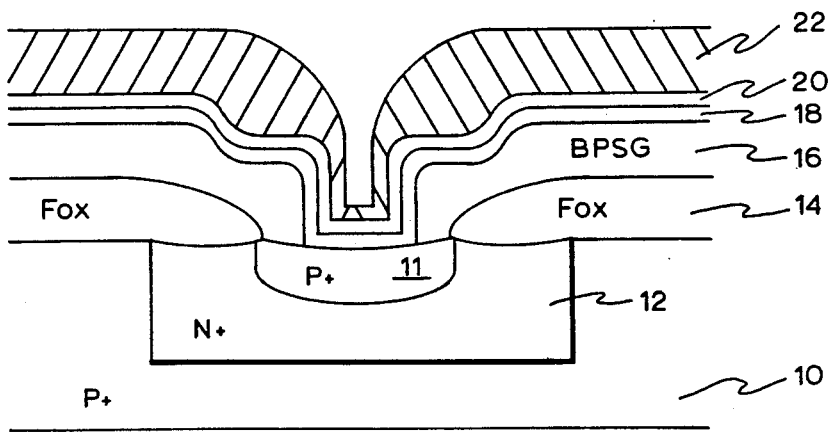

An example of a contact architecture utilizing the present invention is illustrated in FIGS. 2A-2C. The first processing steps of the present invention are similar to FIGS. 1A and 1B of the prior art method. A difference in the present invention compared to FIGS. 1A and 1B is that after the processing steps of FIG. 1A, a silicon etch of 200-300 Å in the contact areas is employed. This is done for the metal -P+ contact resistance case to lower resistance values since boron peak concentration is normally seen at approximately 400 Å below the contact surface.

Referring to the illustration in FIG. 2A, a thin barrier layer of titanium (Ti) 18 has been deposited over the BPSG 16 as well as the contact opening over region 12. In the preferred embodiment, the Ti layer is approximately 250 Å and is deposited onto the contact by a sputtering system, such as a Varian 3290. In practice, the Ti layer should be thick enough to form a continuous layer, but not so thick so as to cause stress fractures and dislocation in the silicon. A layer in the range of 200 Å-500 Å may be utilized. The Ti layer is excellent for adhesion to the silicon substrate surface as the Ti layer reacts with the silicon during subsequent heat treatments to form a thin layer of silicide. Adding approximately 250 Å of Ti to the contact also helps in obtaining consistent and lower values of metal to P+ contact resistance. The addition to the Ti layer effectively reduces the P+ contact resistance, while also maintaining a low N+ contact resistance. The barrier characteristics of TiW greatly improves when coupled to Ti. This is because the Ti layer effectively improves the blocking of aluminum migration to the silicon surface via the TiW grain boundaries.

Titanium tungsten (TiW) 20 is deposited over the thin Ti layer as shown in FIG. 2B. Although titanium tungsten is used in the preferred embodiment of the present invention, other barrier layers, including titanium nitride, may also be employed. A TiW layer with 10% Ti is a typical composition for this barrier layer. The TiW thickness is approximately 1,000 Å, and this barrier metal shows excellent contact resistance for metal to N+ contacts as well as metal to polysilicon contacts. The TiW film is very conformal as opposed to the Ti layer and it significantly enhances step coverage. FIG. 2C shows the completed interconnect system with approximately 6,500 Å of aluminum 22 deposited over the TiW layer. The aluminum and TiW layers along with the Ti layer, are deposited in one cycle in sequential steps by the Varian 3290 sputtering system.

Upon completion of the deposition of the barrier metal sandwich, a very anisotropic etch process is employed for the Ti/TiW/Al metal sandwich that controls corrosion and metal residue. After photoresist has been patterned over the desired contact areas, the first step of the etch process is a native oxide etch, which is used to break through the native oxide of aluminum. This native oxide etch entails using $BCl_3$ and $Cl_2$ at a high DC bias (220 V) at 25 mtorr for approximately 2.5 minutes.

The second step is the actual aluminum etch where chlorine is used as the main etchant of the aluminum film. $BCl_3$ is also used to help in volatalizing chlorides because it is an excellent scavenger. A small amount of a refrigerant, trifluoromethane, produced under the trademark "FREON-23" is utilized in order to build polymer on the sidewalls of aluminum during the etch and it significantly helps in controlling corrosion. Higher DC bias and lower pressure conditions are used to achieved anisotropy. When step two of the etch process is automatically endpointed, meaning that a detector has signaled the end of the aluminum etch, aluminum will have been mostly cleared on the TiW film across the wafer. In order to remove all the residual metal stringers due to etched non-uniformity and topography, a third step of over-etching the aluminum is employed. Since the amount of aluminum film left on the wafer is minimized, the net demand for chlorine reactive species is also reduced. Therefore, only a small amount of chlorine is used. This avoids corrosion due to excess chlorine reactive species. $BCl_3$ and a small amount of refrigerant "FREON-23" is also used in this over-etch.

The fourth step of the etching process consists of etching the titanium tungsten and titanium layers. A refrigerant, tetrafluoromethane, produced under the trademark "FREON-14" is used to etch TiW as tungsten fluorides can be more volatile as compared to tungsten chlorides. Higher DC bias and lower pressure conditions are used to achieve good anisotropy in conjunction with aluminum. Also, higher ion bombardment helps in the sputter etching of the thin titanium layer.

The fifth step in the etching process is the titanium over-etch. $Cl_2$ is used to remove the titanium stringers, since titanium chlorides are more volatile. Also used in this over-etch are $BCl_3$ and refrigerant "FREON-14". After the titanium over-etch, a passivation etch is needed for further sidewall polymerization to avoid moisture-related corrosion. Refrigerant "FREON-23" is used for this passivation etch.

Automatic endpointing can be obtained for both Al on TiW and TiW on oxide layers. Moreover, TiW is an excellent etch barrier for aluminum and one could give as much over-etch as needed.

FIGS. 3A and 3B are graphs that illustrate the metal to N+ contact resistance, and the metal to P+ contact resistance for three different interconnect structures. In the two figures, two separate cases are illustrated, the Kelvin case and the Contact String case. The Contact String case shows the contact resistance for the sum of a serial array of contacts. The results in the graphs show the sum resistance of a combination of contacts interconnected. The Kelvin case, which is the preferred method of determining contact resistance, shows the resistance of only one single contact. The two graphs show that only the Ti/TiW/Al barrier scheme has low contact resistance (less than 100 ohms) for both N+ and P+ silicon regions. While the titanium layer has no effect on the N+ contact resistance when added to a TiW/Al interconnect scheme, the addition of titanium greatly stabilizes and reduces the contact resistance to a P+ region when added to a TiW/Al interconnect scheme.

Figure 4:
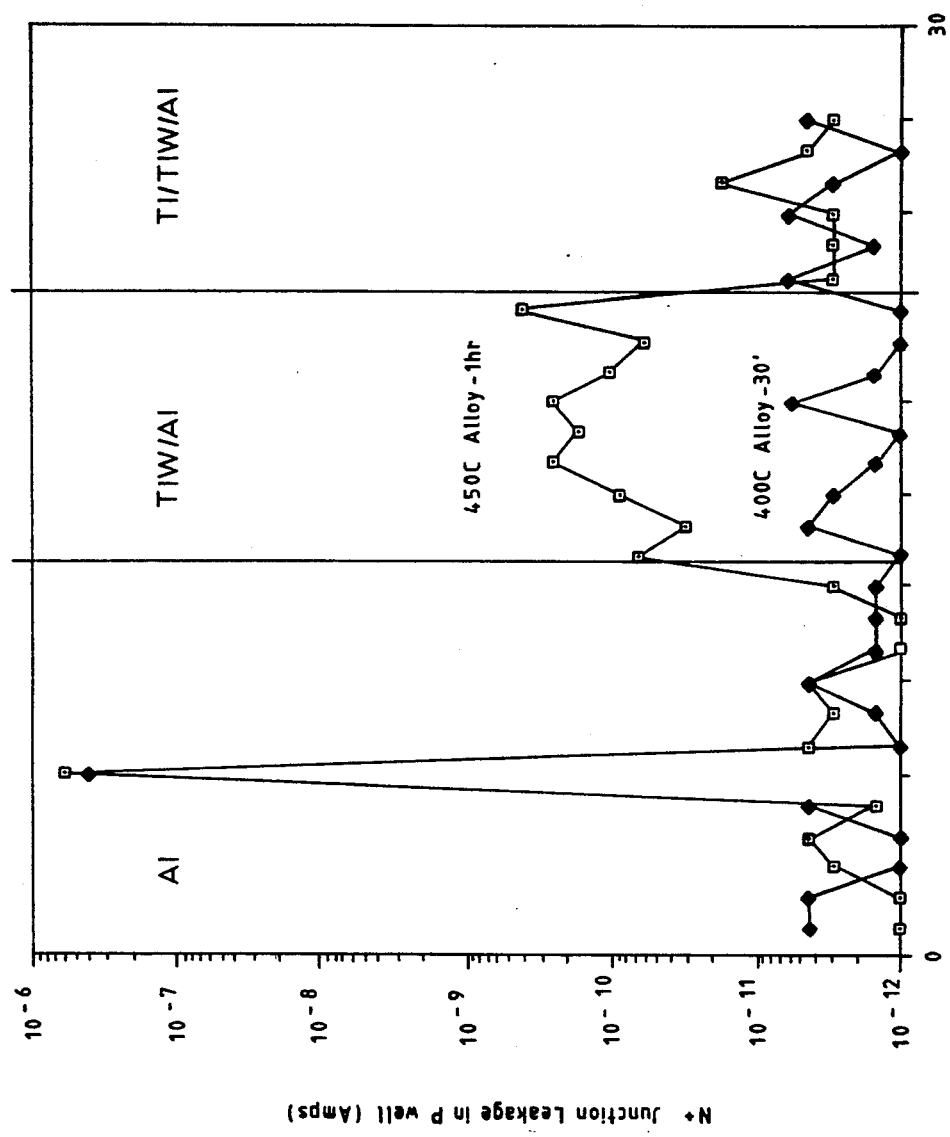
FIG. 4 is a graph illustrating junction leakage values for both the prior art method and the present invention.

FIG. 4 is a graph illustrating the magnitude of junction leakage for three different interconnect systems: Al, TiW/Al and Ti/TiW/Al. The junction leakage of the Ti/TiW/Al interconnect system is shown to be on the order of picoamps and thus gives lower and more consistent values as compared to the other two interconnect systems. It is known in the art that the TiW/Al will be unstable for more than thirty minutes at 450 C. The TiW begins to react with Al at 450 C. by forming $TiAl_3$ and $WAl_{12}$ compounds as confirmed by the 25% increase in metal sheet resistance values. Also, at 450 C., aluminum begins to migrate through TiW grain boundaries, and the addition of the thin titanium layer of the present invention effectively prevents the aluminum from migrating into the silicon.

Thus, a metal contact architecture has been described.

I claim:

1. A method for forming a barrier metal scheme for an interconnect system implemented in integrated devices comprising the following steps:
   providing in a first conductivity type substrate a first buried layer of a second conductivity type;
   forming a well for a contact area of said first conductivity type implanted into said first buried layer;
   etching away a portion of said contact area;
   forming a first oxide layer over said substrate and etching away said first oxide layer form said buried layer;
   forming a silicate glass layer over said first oxide layer and etching away said silicate glass layer from said contact area;
   forming a titanium layer over said silicate glass layer and said contact area;
   forming a metal barrier layer over said titanium layer;
   forming an aluminum layer over said metal barrier layer and physically contacting said metal barrier layer at said well;
   patterning said aluminum, metal barrier and titanium layers leaving said layers only over said contact area;
   said patterning comprising the following etching steps:
   a native oxide etch to break through native oxide of aluminum;
   an aluminum etch using chlorine, $BCl_3$ and trifluoromethane,
   an aluminum over-etch;
   a Ti/metal barrier etch using tetrafluoromethane
   a Ti overetch to remove Ti stringers using tetrafluoromethane $BCl_3$ and $Cl_2$;

a passivation etch using trifluoromethane to avoid corrosion.

2. The method of claim 1 wherein said first conductivity type is P-type.

3. The method of claim 2 wherein said first oxide layer is a field oxide of approximately 5,000 Å.

4. The method of claim 3 wherein said silicate glass is borophosphosilicate glass of approximately 6,000-10,000 Å.

5. The method of claim 1 wherein said Ti layer is approximately 500 Å.

6. The method of claim 1 wherein said metal barrier is comprised of TiW and is approximately 1,000 Å.

7. The method of claim 1 wherein said aluminum layer is approximately 6,500 Å.

8. The method of claim 1 wherein the etching of said well is approximately 200-300 Å deep.

9. A method for forming a barrier metal scheme for an interconnect system in integrated devices comprising the following steps:

provinding in a first conductivity type substrate a first buried layer of a second conductivity type;

forming a well for a contact area of said first conductivity type implanted into said first buried layer;

etching away a portion of said contact area;

forming a first oxide layer over said substrate and etching away said first oxide layer from said buried layer;

forming a silicate glass layer over said first oxide layer and etching away said silicate glass layer from said contact area;

forming a titanium layer over said silicate glass layer and said contact area;

forming a metal barrier layer over said titanium layer;

forming an aluminum layer over said metal barrier layer;

patterning said aluminum, metal barrier and titanium layers leaving said layers only over said contact area comprising the following etching steps:

a native oxide etch to break through native oxide of aluminum;

an aluminum etch using chlorine, $BCl_3$ and trifluoromethane an aluminum overetch;

a Ti/metal barrier etch using tetrafluoromethane a Ti overetch to remove Ti stringers using tetrafluoromethane $BCl_3$ and $Cl_2$;

a passivation etch using trifluoromethane to avoid corrosion.

10. The method of claim 9 wherein said first conductivity type is P-type.

11. The method of claim 10 wherein said first oxide layer is a field oxide of approximately 5,000 Å.

12. The method of claim 11 wherein said silicate glass is borophosphosilicate glass of approximately 6,000-10,000 Å.

13. The method of claim 12 wherein said Ti layer is approximately 500 Å.

14. The method of claim 13 wherein said metal barrier is comprised of TiW and is approximately 1,000 Å.

15. The method of claim 14 wherein said aluminum layer is approximately 6,500 Å.

16. The method of claim 15 wherein the etching of said well is approximately 200-300 Å deep.

* * * * *